(12) United States Patent
Fournel et al.

(10) Patent No.: US 9,321,636 B2
(45) Date of Patent: Apr. 26, 2016

(54) METHOD FOR PRODUCING A SUBSTRATE HOLDER

(75) Inventors: Frank Fournel, Villard-Bonnot (FR);
Laurent Bally, Saint-Georges-de-Commiers (FR); Marc Zussy, Saint-Egreve (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 185 days.

(21) Appl. No.: 14/000,354

(22) PCT Filed: Feb. 16, 2012

(86) PCT No.: PCT/EP2012/052672
§ 371 (c)(1),
(2), (4) Date: Oct. 2, 2013

(87) PCT Pub. No.: WO2012/110591
PCT Pub. Date: Aug. 23, 2012

(65) Prior Publication Data
US 2014/0014618 A1    Jan. 16, 2014

(30) Foreign Application Priority Data

Feb. 18, 2011 (FR) .................................. 11 51340

(51) Int. Cl.
*B44C 1/22* (2006.01)
*B81C 3/00* (2006.01)
(Continued)

(52) U.S. Cl.
CPC ............ *B81C 3/001* (2013.01); *H01L 21/2007* (2013.01); *H01L 21/6835* (2013.01); *H01L 2221/68322* (2013.01); *H01L 2221/68327* (2013.01); *H01L 2221/68381* (2013.01)

(58) Field of Classification Search
CPC ............... B81C 3/001; B81C 2203/03; B81C 2203/037; B81C 2203/038; B81C 2203/033; B81C 2203/05; H01L 21/2007; H01L 21/2015
USPC ...................... 216/33, 34, 35, 36, 40, 99, 106
See application file for complete search history.

(56) References Cited

U.S. PATENT DOCUMENTS

| 5,753,132 A | * | 5/1998 | Shamouilian et al. .......... 216/33 |
| 5,904,548 A | * | 5/1999 | Orcutt .......................... 438/462 |

(Continued)

FOREIGN PATENT DOCUMENTS

| EP | 1 975 998 | 10/2008 |
| WO | 02 095795 | 11/2002 |

(Continued)

OTHER PUBLICATIONS

International Search Report Issued May 9, 2012 in PCT/EP12/052672 Filed Feb. 16, 2012.

*Primary Examiner* — Lan Vinh
(74) *Attorney, Agent, or Firm* — Oblon, McClelland, Maier & Neustadt, L.L.P.

(57) ABSTRACT

A method for producing a holder of at least one substrate from a first and a second plate, each including first and second parallel flat faces, the method including: a) delimitation on the first face of the second plate of plural surfaces by a non-bondable area in which a direct bonding with a face of the first plate is prevented; b) bringing the first face of the second plate into contact with the first face of the first plate; c) direct bonding between the first faces except in the non-bondable area; and d) removal of the portions of the second plate located vertically below surfaces inside the non-bondable area.

25 Claims, 4 Drawing Sheets

Figure 1A:
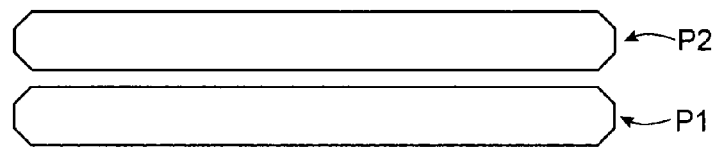

(51) Int. Cl.
*H01L 21/20* (2006.01)
*H01L 21/683* (2006.01)

(56) References Cited

U.S. PATENT DOCUMENTS

| | | | |
|---|---|---|---|
| 6,740,853 B1* | 5/2004 | Johnson et al. | 219/444.1 |
| 2005/0009246 A1* | 1/2005 | Enquist et al. | 438/127 |
| 2006/0245906 A1 | 11/2006 | Pelzmann et al. | |
| 2007/0184580 A1 | 8/2007 | Klootwijk et al. | |
| 2008/0242051 A1 | 10/2008 | Yamazaki et al. | |
| 2010/0120226 A1 | 5/2010 | Yamazaki et al. | |
| 2010/0248444 A1 | 9/2010 | Yamazaki et al. | |
| 2010/0311222 A1 | 12/2010 | Yamazaki et al. | |
| 2011/0277928 A1 | 11/2011 | Araki et al. | |
| 2013/0075365 A1 | 3/2013 | Fournel et al. | |

FOREIGN PATENT DOCUMENTS

| | | |
|---|---|---|
| WO | 2005 083774 | 9/2005 |
| WO | 2010 087226 | 8/2010 |
| WO | 2011 018780 | 2/2011 |

* cited by examiner

METHOD FOR PRODUCING A SUBSTRATE HOLDER

TECHNICAL FIELD AND PRIOR ART

The present invention relates to a method for producing a substrate holder intended to act as a receptacle for at least one substrate smaller than the substrates normally used in microelectronic processes.

In the field of microelectronics and nanoelectronics, various operations are accomplished on substrates, which are made for example of silicon. Chemical vapour phase depositions may be accomplished. Certain machines enabling such depositions to be accomplished are designed for substrates 300 mm in diameter. When the substrate is 200 mm in diameter and when it is desired to use a machine designed for plates 300 mm in diameter, a substrate holder is used which is 300 mm in diameter, which comprises a receptacle to receive the 200 mm substrate, and this holder forms an adapter for the substrate.

There are several manufacturing methods by which such a substrate holder may be produced.

The choice may be made to produce a cavity in a plate of a diameter suitable for the machines.

The cavity may be made directly by photolithography and chemical or ion etching. It may also be produced with a mechanical thinning machine comprising a grinding wheel suitable for lapping the centre of a substrate.

To reduce the risks of the substrate coming out of the cavity, the depth of the latter is at least equal to half the thickness of the plate to be held. Due to this the material between the base of the cavity and the rear face of the holder is relatively thin, which may pose problems relating to the mechanical strength of the holder. For example, to produce a holder for a silicon wafer 200 mm in diameter and 725 µm thick in a machine which uses plates 300 mm in diameter and 750 µm thick, a cavity 200 mm in diameter and 350 µm deep is made in the plate which is 300 mm in diameter. With such a cavity the 300 mm plate is then more flexible. This flexibility can then cause an excessive deformation of the plate, for example during the steps of loading and unloading carried out by certain robots, making it impossible to use them in certain machines. This small remaining thickness of silicon underneath the cavity may even weaken the substrate holder very considerably, and the holder may then fracture when handled.

It is also difficult to control the base of the cavity, in terms of roughness, flatness and cleanliness. For example, after a step of mechanical thinning as described above, there is at the surface of the lapped material a work-hardened area several micrometers thick which may be a very substantial source of particulate contamination, making it impossible to use this holder produced in this manner in a clean room. In the case of production by photolithography and chemical or ion etching, roughness and flatness are very difficult to control, since it is impossible to rework the surface using conventional mechano-chemical polishing techniques.

Another method involves bonding on to the surface of a plate of parts made of various materials which immobilise the wafer. The problems of reproducibility of the positioning of the parts and of the temperature resistance of the adhesive used in the technological process applied to the wafer are then posed.

DESCRIPTION OF THE INVENTION

One aim of the present invention is consequently to provide a method for producing a substrate holder enabling a satisfactory surface condition of the base of the cavities to be obtained, and to produce substrate holders of sufficient rigidity.

The aim stated above is attained by bonding at least two plates of a diameter suitable for the machines to be used, and by delimiting the cavity on one of the plates, before bonding the two plates. The cavities are delimited on one face of one of the plates by producing areas of reduced, or zero, direct bonding aptitude compared to the remainder of the face. After the two plates are bonded directly the plate portions delimited by said areas are removed, forming the cavities by this means. The bonding energy in the areas with reduced, or zero, bonding aptitude is less than 200 mJ/m$^2$.

In one embodiment the areas are formed by the perimeter of the cavities made, for example, by a saw cut.

In another embodiment the entire section of the cavity has reduced, or zero, bonding aptitude, which may be obtained, for example, by modifying the surface condition or removing material from the surface.

In other words, the method according to the present invention uses at least two plates of a first diameter, and makes areas on one of the plates where bonding is made difficult, or impossible. By this means, mixed surfaces are produced with areas capable of bonding, and areas which are not capable of bonding and/or areas capable of bonding surrounded by areas which are not capable of bonding. The areas not capable of bonding or the areas capable of bonding surrounded by areas not capable of bonding delimit the positions of the future cavities. When these areas not capable of bonding have been produced, the two plates of a first diameter are prepared, to assemble them by direct bonding. The assembly interface then has bonded areas and unbonded areas. The cavities of the substrate holder are then revealed by removing blocks of plate located directly below or inside the areas not capable of bonding.

Since the holders produced in this manner comprise a full plate, their rigidity is at least that of a plate conventionally used in the technological processes.

One subject-matter of the present invention is then a method for producing a holder of at least one substrate from at least one first and one second plate, each comprising first and second parallel flat faces, comprising the following steps:

a) delimitation on the first flat face of the second plate of at least one surface by means of an area having, with one face of the first plate, bonding properties inferior to those of the surface with the face of the first plate, called a weak bonding area, where the bonding energy in the weak bonding area is less than 200 mJ/m$^2$, b) bringing the first face of the second plate into contact with the second face of the first plate, c) direct bonding between said first and second faces, d) removal of the portion of the second plate located directly below the surface inside the weak bonding area.

The cavities obtained in this manner are preferably more than 5 µm deep, or greater than 50 µm or 10 µm deep.

In one embodiment, in step c) there is no bonding in the weak bonding area.

For example, the weak bonding area is formed by at least one first saw cut. The weak bonding area is, for example, square in shape.

In another embodiment, the method comprises a step of treatment of the surface such that it has bonding properties which are inferior to those of the rest of the first face of the second plate. The step of surface treatment may comprise a step of increasing the roughness of said surface, such that bonding with the second face of the first plate is prevented. As a variant, the step of surface treatment comprises a step of removal of the material from said surface so as to create a clearance between said surface and the first face of the first plate.

The step of increasing the roughness or of removal of material to prevent contact may be implemented by etching, for example with tetramethylammonium hydroxide.

The method may advantageously comprise, prior to step a) of delimitation of the at least one surface, a step of formation of a thermal oxide or a nitride layer on the surface of at least the second plate and, after step a), a step of removal of the thermal oxide formed on the surface, for example by means of an acid solution.

Step d) may be obtained by making second saw cuts in the second face of the second plate at right angles to the first saw cuts, until the first saw cuts are reached, and until a block of material of the second plates located vertically below the surface is released. The first saw cuts are, for example, identified by infrared or acoustic observation.

As a variant, step d) is obtained by thinning the second plate from its second face until the first saw cuts are reached, and until a block of material of the second plate located vertically below the surface is released.

According to another embodiment, prior to step a) the second plate is assembled with a third plate comprising first and second parallel flat faces by direct bonding between the second face of the second plate and a first face of the third plate, where said direct bonding has bonding energy greater than the bonding energy between the first face of the second plate and the second face of the first plate outside the weak bonding area.

The method may comprise, prior to the assembly of the second and third plates, the formation of a thermal oxide layer on the surface of at least the second and third plates.

For example, the bonding between the second face of the second plate and a first face of the third plate is a hydrophilic bonding, and the bonding between the first face of the second plate and the second face of the first plate is a hydrophobic bonding.

The method may comprise, after the second and third plates have been assembled, the removal of the oxide layers of at least the second and third plates.

In this embodiment the depth of the first saw cuts is preferably less than the thickness of the second plate.

Step d) may be obtained by exerting a separation force between the first face of the third plate and the second face of the second plate at a lateral end of the stack of the second and third plates.

Advantageously, during step a) several surfaces are delimited.

For example, the plates are between 100 mm and 450 mm in diameter and between 525 µm and 1000 µm thick.

Advantageously, the at least one first saw cut and/or one second saw cut are aligned at 45° to the crystalline planes of the second and/or of the third plate.

BRIEF DESCRIPTION OF THE ILLUSTRATIONS

Figure 2A:
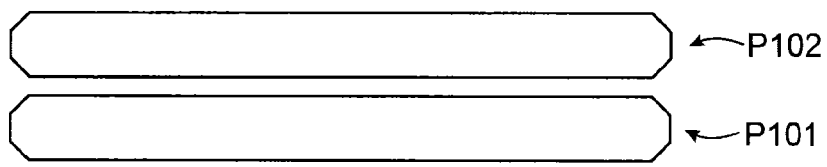
Figure 2B:
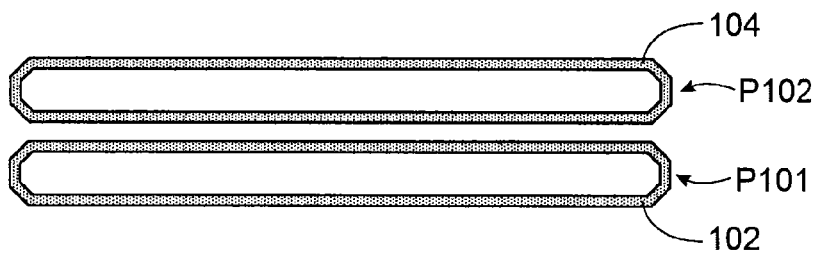
Figure 2C:
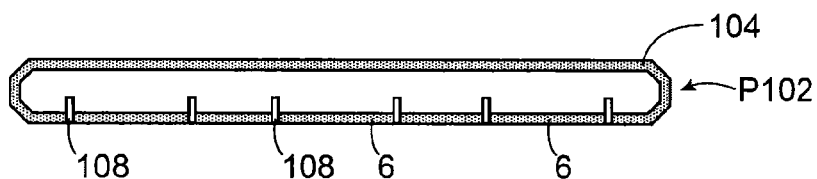
Figure 2D:
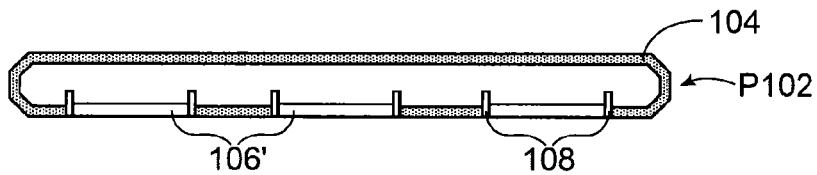
Figure 2E:
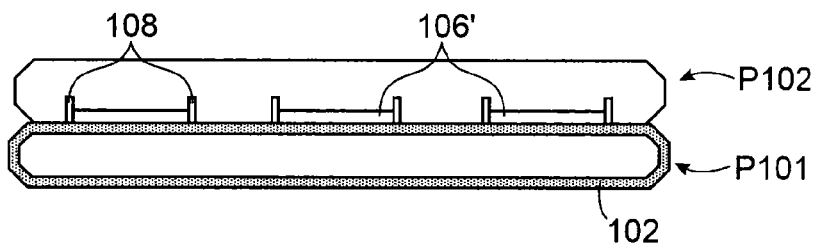
Figure 2F:
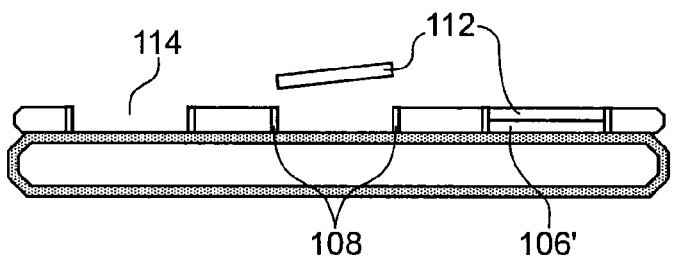
Figure 3A:
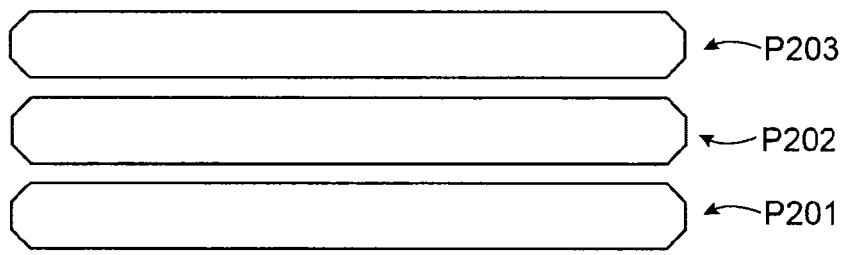
Figure 3B:
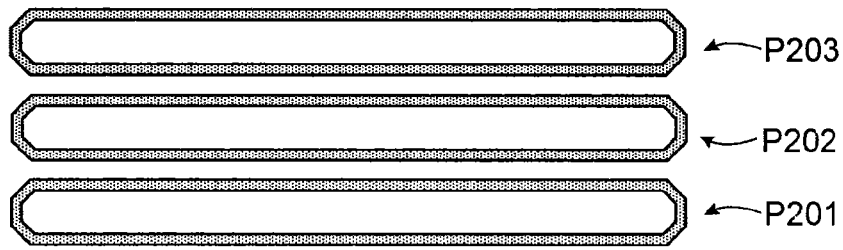
Figure 3C:
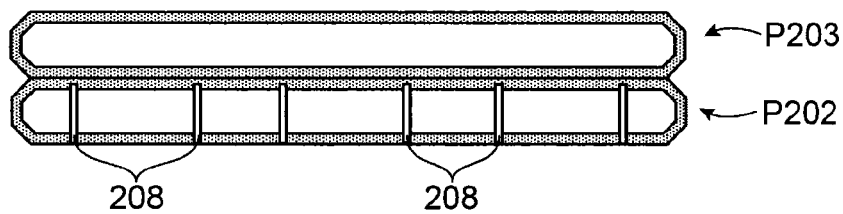
Figure 3D:
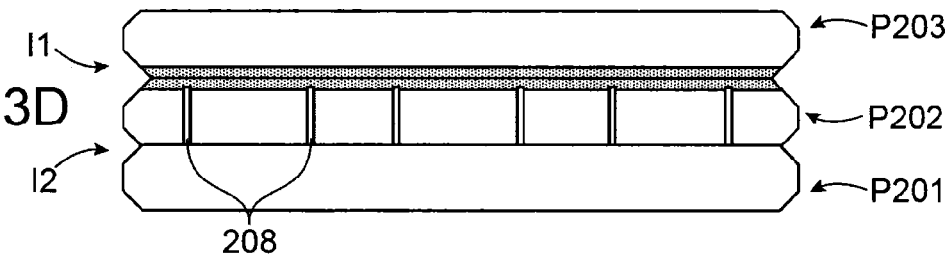
Figure 3E:
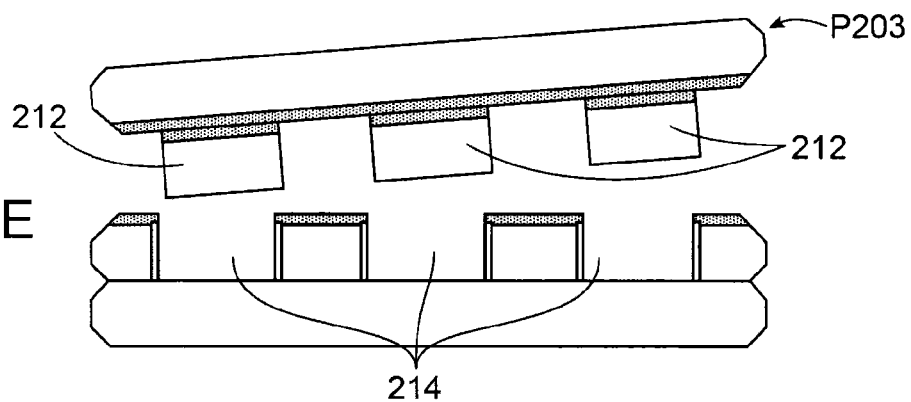
Figure 4:
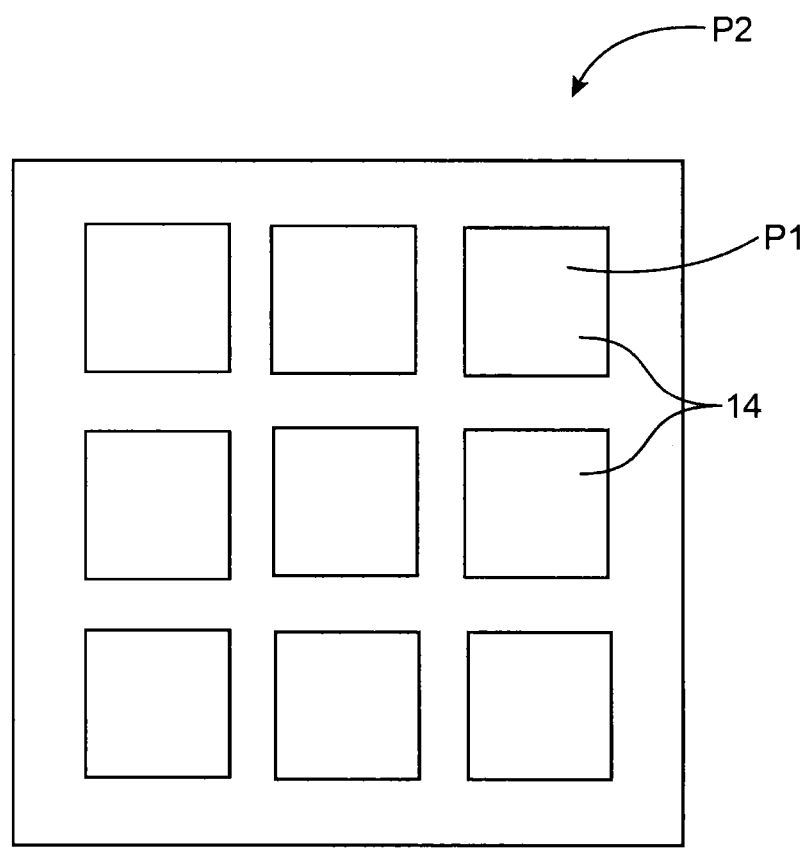

The present invention will be better understood using the description which follows and the appended illustrations, in which:

FIGS. 1A to 1F are schematic representations of different steps of production of one embodiment of a method of manufacturing a substrate holder, FIGS. 2A to 2F are schematic representations of different steps of production of another embodiment of a method of manufacturing a substrate holder, FIGS. 3A to 3E are schematic representations of different steps of production of another embodiment of a method of manufacturing a substrate holder, FIG. 4 is a schematic representation of a top view of a substrate holder obtained using the methods of FIGS. 1A to 3E.

DETAILED DESCRIPTION OF PARTICULAR EMBODIMENTS

The production methods which will be described enable holders to be produced for one or more substrate(s), and preferably several substrates. Each method uses at least two large-diameter plates, where this large diameter is equal to a diameter suitable for the machines intended to implement the technological processes on the substrates which are to be held. The large-diameter plates may be, for example, silicon plates 300 mm in diameter and 750 µm thick. The cavity may then be dimensioned to contain a wafer 200 mm in diameter and 750 µm thick. Typically the large-diameter plate diameter may be between 100 mm and 450 mm, and typically their thickness may be between 525 µm and 1000 µm. One of the two plates may be thinned after direct bonding to obtain a thickness of between 5 µm and the thickness before bonding. As regards the cavity, typically it may be dimensioned to contain plates of between 50 mm and 300 mm with thicknesses of between 5 µm and 750 µm. The different plates may be made of silicon, germanium, AsGa, InP, Saphir, SiC, fused silica, glass or GaN. The cavities are more than 5 µm deep, or greater than 50 µm or 10 µm deep.

The methods according to the invention which will be described are described with a view to manufacturing a substrate holder 300 mm in diameter to receive wafers 50 mm in diameter. The holder is made from plates 300 mm in diameter and 750 µm thick.

In the remainder of the document the large-diameter plates will be designated "plate" and the small-diameter plates will be designated "small plate".

In a first step represented in FIG. 1A, two plates P1, P2 of identical diameter, for example made of monocrystalline silicon, are taken.

Figure 1B:
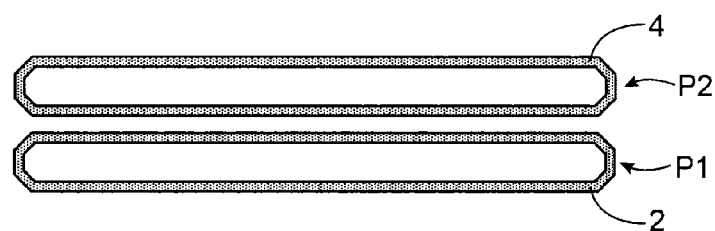

In a subsequent step represented in FIG. 1B, a layer 4, respectively intended to allow selective etching of the silicon, is generated on the surface of plate P2. Layer 4 is for example a thermal oxide layer.

Advantageously, a thermal oxide layer is also formed on plate P2, which allows direct bonding to be facilitated. The layers of thermal oxide are, for example, obtained in an oxidising atmosphere, for example using steam, at a temperature of between 930° C. and 970° C., for example equal to 950° C. Layers 2, 4 are, for example, between 100 nm and 200 nm thick, for example 150 nm thick.

As a variant, other layers having etching selectivity relative to the material of plate P2 may be used: for example, a nitride layer for a silicon plate.

Figure 1C:
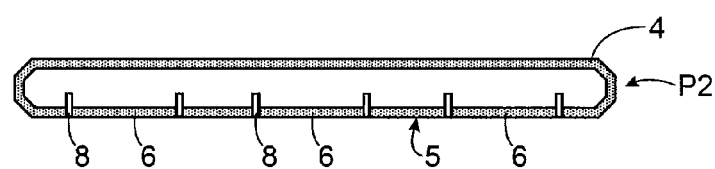

In a subsequent step represented in FIG. 1C, one of faces 5 of plate P2, called the front face, of areas 6, corresponding to the position of the cavities intended to receive the small plates, is delimited. These delimitations are obtained by making saw cuts 8 through layer 4 so as to traverse oxide layer 4 and to cut into the silicon. For example, the saw cuts are between 125 µm and 175 µm deep, for example 150 µm deep, and are between 100 µm and 200 µm wide, for example 150 µm wide.

The delimitations are, for example, square in shape, the length of the sides of the square being slightly greater than the diameter of the small plates. For example, the length of the side of the square is between 50.5 mm and 51.5 mm, for example equal to 51 mm, to accommodate a small plate 50 mm in diameter.

A clearance of 1 mm+/−0.5 mm is sufficient to facilitate the positioning of the future wafers, without however allowing them excessive possible movement.

Advantageously, the saw cuts are aligned at 45° to the crystalline planes to make the plate less fragile.

In the example described, the cavities are square in shape; however, the choice could be made to produce cavities which are circular in shape by making a circular saw cut.

The saw cuts may be made by a rotary blade. For example, saws for a silicon plate suitable for the present invention are sold commercially, for example by the company DISCO.

Figure 1D:
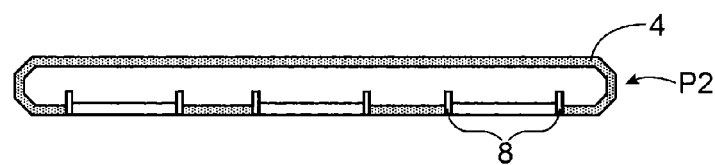

In a subsequent step represented in FIG. 1D, the oxide layer is removed within the area is delimited by saw cuts 8, for example by pouring hydrofluoric acid on these areas. Due to saw cuts 8, the acid is confined within the areas and does not attack the oxide layer between areas 6. In areas 6 the silicon is exposed. In the case of a nitride layer, orthophosphoric acid is used to remove the nitride layer.

In a subsequent step, second plate P2 is immersed in a solution suitable for etching the silicon of areas 6; this may for example be tetramethylammonium hydroxide (TMAH) at a temperature of 80° C. The TMAH does not etch the silicon protected by the oxide. As a variant, the etching solution may be KOH. The KOH and the TMAH may be used with a nitride protective layer.

The depth of the etching depends on the time during which second plate P2 remains immersed in the solution. For example, with an immersion time of 30 minutes, the silicon is etched over a depth of between 5 μm and 15 μm, for example a depth of 10 μm. There is no requirement for the etching to be very deep; a depth of several μm is sufficient to prevent bonding. Shallow etching also allows time to be saved, and allows the required protective layer to be made as thin as possible. In addition, this prevents the plate from being weakened.

Figure 1E:
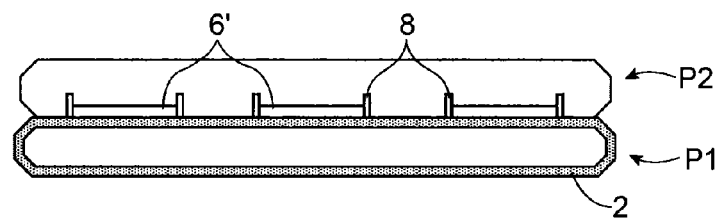

Second plate P2, obtained at the end of this step, is represented in FIG. 1E; it then comprises areas 6', the base of which is recessed from the surface of the plate In a subsequent step, the remainder of the oxide layer on second plate P2 is removed, for example by immersing it in a hydrofluoric acid bath. This enables the surface of the protective layer which was subjected to the chemical attack to be removed, enabling a surface suitable for bonding to be regained.

Figure 1F:
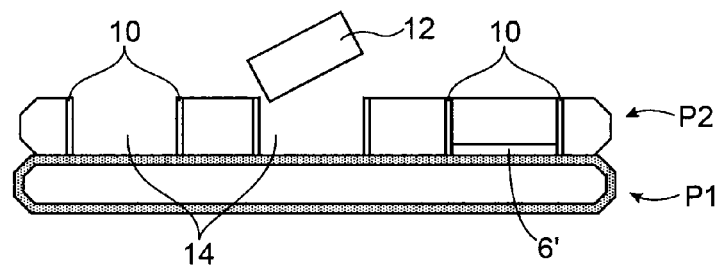

In a subsequent step represented in FIG. 1F, first plate P1 and second plate P2 are bonded. To accomplish this the surfaces to be brought into contact are first cleaned. For example, they may be cleaned by chemical means, as follows:

Cleaning is accomplished with a solution of $H_2SO_4/H_2O_2$ 3:1 at 180° C. for 10 min.; rinsing is then undertaken for 10 min. in deionised water. A second cleaning operation is then accomplished with a solution of $NH_4OH/H_2O_2/H_2O$ 1:1:5 at 70° C. for 10 min., followed by rinsing once again in deionised water for 10 min.

The oxide layer on plate P1 could be removed. However, as has been explained above, it may facilitate the bonding.

The front face of the second plate is then brought into contact with one of the faces of the first plate and direct bonding is accomplished.

"Direct bonding" is understood to mean bonding by molecular adhesion during which two flat surfaces adhere to one another without application of adhesive.

The bonding is advantageously accomplished at ambient temperature and pressure. The roughness of the surfaces is preferably less than 0.5 nm RMS.

The bonding takes place between the front fact of second plate P2 and the front face of first plate P1 except in areas 6', which are recessed relative to the surface of front face 5, due to the removal of silicon.

Advantageously, to strengthen the bonding, a step of annealing is accomplished, for example at 1100° C. for 2 h.

In a subsequent step, areas 6' are identified by a characterisation technique, for example by infrared or acoustic observation. Saw cuts 10 at right angles to saw cuts 8 are then made in the rear face of second plate P2. The depth of second saw cuts 10 is such that the second saw cuts join the first saw cuts. If first saw cuts 6 are 150 μm deep and second plate P is initially 750 μm thick, second saw cuts are made 650 μm deep. Blocks 12 of silicon with a square section are then released. These blocks 12 are removed and square cavities 14 are obtained which are able to receive and immobilise small plates 50 mm in diameter. To remove the blocks the structure is, for example, turned upside-down and the blocks fall out by gravity; or they may be gripped using a system generating a partial vacuum such as vacuum tweezers. If only the periphery of the cavity has weak bonding, a force is applied to break the bonding interface, for example by means of vacuum tweezers.

The surface condition, in terms of roughness and flatness, of the base of the cavities, is that of oxide layer 2 of the first plate, which matches approximately the initial surface condition of first plate P1.

The choice may be made to rinse the base of the cavities, for example with a pressurised deionised water hand shower.

In FIG. 4 a top view of such a substrate holder obtained in this manner may be seen.

As a variant, it is possible, instead of removing matter such that there is a clearance between the base of the areas vertically below the cavity, to create a sufficient roughness to prevent bonding between these surfaces and the first plate. This roughness may be obtained by a TMAH bath.

It may also be envisaged to delimit areas 6 by an area forming the perimeter of the cavity having sufficient roughness to prevent bonding, instead of one or more saw cuts. This area of sufficient roughness forms a surface with weak bonding.

By this means, instead of producing areas in which bonding is prevented, bonding areas are produced having weak bonding energy compared to the remainder of the surface. In the present application, weak bonding is understood to mean bonding the bonding energy of which is less than 200 $mJ/m^2$.

Generally, the surfaces of the strong bonding areas and the surfaces of the weak bonding areas are subjected to different surface and/or roughness preparations, such that strong bonding is obtained, i.e. one with a bonding energy greater than 200 $mJ/m^2$, in the areas which are to remain bonded, and a weak bonding, i.e. one with a bonding energy less than 200 $mJ/m^2$, in the areas where the blocks must be eliminated.

Such energy may be obtained typically by hydrophobic bonding, which has a lower bonding energy.

It may also be obtained by hydrophilic bonding. To this end, the surface is for example prepared so as to limit the number of OH surface groups, which are responsible for the bonding. This may be obtained by choosing the preparation chemistry appropriately.

As a variant, roughness may also be involved. As an example, in the case of bonding between an $SiO_2$ surface or a silicon surface covered with a native oxide, a roughness less than 0.3 Angström RMS (measured by AFM on an area measuring 1 µm×1 µm) will enable an energy of less than 200 mJ/m$^2$ to be obtained.

The roughness required in order to obtain an area with a low bonding level may be produced as follows:

after having exposed the silicon surfaces in areas 6 to modify their roughness by using TMAH (as with etching), but at a lower temperature, for example between 50 and 60, the effect of which is to create a roughness without leading to an excessive removal of material. As a variant, an SC1 treatment (NH4OH, H2O2, H2O) is also possible. Subsequent treatment with hydrofluoric acid, which is implemented to eliminate the oxide, also has the effect of increasing hydrophobicity in the "rough" silicon areas, reducing further the bonding force in these areas.

In addition, the step of annealing is modified such that the bonding energy in the weak bonding area remains less than 200 mJ/m$^2$. Alternatively, the step of annealing may be eliminated.

Lastly, after eliminating the blocks, a thermal treatment strengthening the bonding in the strong bonding areas may be implemented.

In FIGS. 2A to 2F the steps of another embodiment of a method of producing a substrate holder may be seen represented schematically. The manufacturing method steps are similar to those of the method described above until and comprising the step of assembly of first plate P101 and second plate P102.

The plates are oxidised and are covered with an oxide layer 102, 104 respectively (FIG. 2B).

Areas 106 are then delimited by saw cuts 108 (FIG. 2C).

The areas are etched, giving recessed areas 106' (FIG. 2D).

Plates P101, P102 are assembled, by their front faces (FIG. 2E).

Cavities 114 are revealed in this method by thinning the rear face of second plate P102 so as to join saw cuts 108 made in the front face of second plate P102. If the saw cuts are 750 µm deep, approximately 350 µm is removed. When sufficient material has been removed, blocks 112 delimited by saw cuts 108 are released. By removing these blocks, cavities of square section, with sides measuring 50 µm, able to receive small plates 50 µm in diameter, are obtained.

This thinning may be accomplished by lapping and/or by a chemical attack. In the case of a chemical attack, first plate P101 is protected.

The blocks are removed as in the previous embodiment, for example by turning the structure upside-down, or by removing them by suction.

This embodiment allows simultaneous revelation of all the cavities, since the thinning is accomplished over the entire rear face simultaneously. In addition, it requires no precise knowledge of the position of the future cavities, unlike the previously described method.

In FIGS. 3A to 3E another embodiment of the method for manufacturing a substrate holder may be seen. This method is distinguished from the two previously described embodiments in that it uses three plates.

In a first step represented in FIG. 3A, three plates P201, P202, P203 of identical diameter, for example made of monocrystalline silicon, are taken.

In a subsequent step represented in FIG. 3B, a thermal oxide layer is formed on plates P202 and P203, for example by putting the plates at 950° C. in an oxidising atmosphere. A thermal oxide layer may also be formed on plate P201.

The front faces and rear faces of the plates are covered with thermal oxide.

In a subsequent step, third plate P203 and second plate P202 are assembled by bonding the front face of third plate P203 on to the rear face of second plate P202.

The bonding is, for example, direct. It is, for example, of the hydrophilic type. To accomplish this, cleaning of the faces to be bonded may be accomplished as follows prior to the bonding: the front face of third plate P203 and the rear face of second plate P202 are cleaned with a solution of $H_2SO_4/H_2O_2$ 3:1 at 180° C. for 10 min. The faces are then rinsed for 10 min. in deionised water. A second cleaning operation is then accomplished with a solution of $NH_4OH/H_2O_2/H_2O$ 1:1:5 at 70° C. for 10 min., followed by rinsing once again in deionised water for 10 min.

The oxide layers on the second and third plates enable a hydrophilic bonding to be produced. The bonding accomplished in this manner has a first energy which will subsequently be designated "strong".

In a subsequent step, saw cuts are made on the front face of second plate P202, forming for example 51 mm squares, the squares being distributed on the surface of the front face.

It is also advantageous to make saw cuts aligned at 45° to the crystalline planes, to make the plate less fragile.

Saw cuts 208 preferably do not traverse the entire thickness of second plate 202, i.e. they do not reach third plate P203, so as to reduce the risks of weakening third plate P203. A thickness of 10 µm of second plate P202 may, for example, be left at the bottom of the saw cuts. The assembly on conclusion of this step is represented in FIG. 3C.

However, it may be envisaged for saw cuts 208 to traverse the whole of second plate P202 without cutting into third plate P203. In this case the saw cuts are approximately 750 µm deep. A method in which the saw cuts cut into the third plate would not go beyond the scope of the present invention.

In a subsequent step, the assembly of second plate P202 and third plate P203 is deoxydised. First plate P201 is also deoxydised even if it has not been subjected to the step of formation of oxide layer, so as to remove the native oxide. Advantageously, the deoxydisation is accomplished by a hydrofluoric acid bath. In a subsequent step, the assembly of second plate P202 and third plate P203 with first plate P201 is made by bonding the front face of second plate P202 with the front face of first plate P201 such that the bonding energy between the two faces is less than the bonding energy between second plate P202 and third plate P203. This energy will be designated "weak energy".

The effect of the deoxydisation using the hydrofluoric acid is to passivate by hydrogen the front faces of the first and second plates, which enables hydrophobic bonding to be accomplished.

The assembly obtained in this manner is represented in FIG. 3D.

As a variant, the hydrophobic bonding may be replaced by a degraded hydrophilic bonding by modifying the roughness of the surfaces. The bonding energy of the first hydrophilic bonding may also be increased by undertaking an annealing of the first bonded structure and/or a specific surface treatment such as a plasma activation.

If a hydrophilic bonding I1 is implemented between second plate P202 and third plate P2063 and a hydrophobic bonding I2 is implemented between first plate P201 and second plate P202, the assembly may be subjected to a thermal annealing at 400° C. for 2 h. The annealing strengthens the energies of the hydrophilic bonding and of the hydrophobic bonding; however, this strengthening is more marked with the hydrophilic bonding than with the hydrophobic bonding; the annealing therefore has the advantage of amplifying the bonding energy difference of the two interfaces.

In a subsequent step, third plate P203 is detached, for example by inserting a corner between the front face of third plate P203 and the rear face of second plate P202. When the detachment area reaches a saw cut 208, the detachment occurs in interface I2, which has lower energy. Second plate P202 is consequently separated from first plate P201, and blocks 212 of second plate P202 which are located inside saw cuts 208 are removed with third plate P203, as is represented schematically in FIG. 3E. By this means, cavities 214 are obtained which can receive wafers 50 mm in diameter. The surface condition of the base of the cavities after separation is the same as before bonding.

As a variant, the square-shaped areas delimited between the saw cuts may be made incapable of bonding. Thus, when the third plate is detached, the blocks of the second plate vertically below the unbonded areas of the second plate are removed with third plate; there is then no requirement to manage interfaces with strong and weak bonding energies. In addition, the surface condition of the base of the cavities is that of first plate P201.

To lighten the substrate holder, it is advantageous to make a large number of cavities or large cavities which will not necessarily be used to hold a wafer.

It may be envisaged to use plates made of different materials, for example in the case of three plates, to have different bonding energies.

By virtue of the methods according to the invention, a substrate holder is obtained comprising one or more cavities with very satisfactory control of the depth of the cavity, since this depth is equal to the thickness of one of the two plates, or a very well controlled thickness in the case of thinning.

If it is desired to modify this depth, either a thinner or thicker second plate is used, or the required thinning is modified by modifying the depth of the saw cuts.

A cavity depth will preferably be chosen which is equal to the thickness of the wafer to be held, to ensure that the small plate is held very securely.

In addition, the holders produced in this manner have a full plate in which no saw cut has been made; they are therefore of satisfactory rigidity.

The cleanliness and roughness of the base of the cavity are also very well controlled, since advantageously all the surface treatments to produce the mixed surface are on the other plate.

By virtue of the invention, the roughness may be sufficiently low to allow the small plate to be bonded on to the base of the cavity by capillarity or direct bonding. This bonding possibility is particularly advantageous, since it becomes conceivable to position the substrate holder vertically, or even to turn it upside-down during transport and/or treatment of the small plate, without there being any requirement to add holding elements to the front face of the small plate. The entire surface of the small plate then remains accessible even with a substrate holder which has been turned upside-down.

It may be envisaged for the surface of the first plate or a buried layer which is exposed to have interesting properties facilitating the technological steps on the small plate. The surface or the layer may comprise a thermal insulating material such as, for example, silicon oxide, or a thermally conductive material (if the stop layer is removed, and if this exposes the material of the second large-diameter plate, which could be made of silicon or another material which is a satisfactory heat conductor). This layer may then facilitate heat evacuation during the steps implemented on the small plate. As a variant, the surface or the buried layer may be conductive, for example to facilitate the evacuation of the electric charge.

The heat or electrical conduction properties will be amplified if the small plate is bonded, for example by direct bonding, on to the base of the cavity.

The choice may be made to deposit electrical conductive or electrical insulating layers and/or thermally conductive or thermally insulating layers a short time before or after the direct bonding of the first and second plates.

To facilitate gripping of the wafer held in the cavity, the cavities may have a complex geometry, or they may emerge in one edge of the first plate, for example to allow the passage of vacuum tweezers or of a robot.

The cavities may of course be of another shape, for example a disk shape, or a polygonal shape, such as a triangle, or any other shape.

As a variant, it is conceivable to use a first plate of the diameter suitable for the machines in which the structures are intended to be treated, and second and third plates of smaller diameter.

The invention claimed is:

1. A method for producing a holder of at least one substrate, wherein the holder includes at least one cavity to hold the substrate, from at least one first plate and one second plate, each including first and second parallel flat faces, the method comprising:
    a) delimiting only on the first flat face of the second plate at least one surface corresponding to the cavity to be made, each of the at least one surface having a weak bonding area in which a bonding energy, with a face of the first plate, is less than 200 mJ/m$^2$, the weak bonding area including at least a perimeter of the surface, and portions of the surface other than the weak bonding area having bonding properties which are the same as those of a remainder of the first face of the second plate;
    b) bringing the first face of the second plate into contact with the second face of the first plate;
    c) direct bonding between the first and second faces; and
    d) after said direct bonding, removal of the portion of the second plate located directly below the surface inside the weak bonding area.

2. A method according to claim 1, wherein, in c), there is no bonding in the weak bonding area.

3. A method according to claim 1, wherein the weak bonding area is formed by at least a first saw cut.

4. A method according to claim 1, wherein the weak bonding area is square in shape.

5. A method according to claim 1, wherein the weak bonding area is formed by at least a first saw cut, and by d) thinning the second plate from its second face until the first saw cut or saw cuts is/are reached, and releasing a block of material of the second plate located vertically below the surface.

6. A method according to claim 1, wherein, in a), plural surfaces are delimited.

7. A method according to claim 1, wherein the plates are between 100 mm and 450 mm in diameter, and between 525 μm and 1000 μm thick.

8. A method according to claim 1, wherein the weak bonding area is formed by at least a first saw cut, and wherein the at least one saw cut and/or a second saw cut are aligned at 45° to the crystalline planes of the second and/or third plate(s).

9. A method to claim 1, further comprising, prior to a) delimitation of the at least one surface, formation of a thermal oxide or a nitride layer on the surface of at least the second plate and, after a), removal of the thermal oxide formed on the surface.

10. A method according to claim 9, wherein the removal of the thermal oxide formed on the surface is achieved by an acid solution.

11. A method according to claim 1, wherein the weak bonding area is formed by at least a first saw cut and by d) making two saw cuts in the second face of the second plate at right angles to the first saw cuts until the first saw cuts are reached, and in releasing a block of material of the second plate located vertically below the surface.

12. A method according to claim 11, wherein the first saw cuts are identified by infrared or acoustic observation.

13. A method according to claim 1, further comprising between a) and b), a1) treatment of the surface such that it has bonding properties inferior to those of the remainder of the first face of the second plate.

14. A method according to claim 13, wherein a1) surface treatment comprises increasing a roughness of the surface, such that bonding with the second face of the first plate is prevented.

15. A method according to claim 14, wherein the increasing the roughness of material to prevent bonding is implemented by etching.

16. A method according to claim 15, wherein the etching is achieved with tetramethylammonium hydroxide.

17. A method according to claim 13, wherein a1) treatment of the surface comprises removal of the material from the surface so as to create a clearance between the surface and the first face of the first plate.

18. A method according to claim 17, wherein the removal of material to prevent contact is implemented by etching.

19. A method according to claim 18, wherein the etching is achieved with tetramethylammonium hydroxide.

20. A method according to claim 1, wherein, prior to a), the second plate is assembled with a third plate comprising first and second parallel flat faces by direct bonding between the second face of the second plate and a first face of the third plate, the direct bonding having bonding energy greater than bonding energy between the first face of the second plate and the second face of the first plate outside the weak bonding area.

21. A method according to claim 20, further comprising, after the second and third plates have been assembled, removal of the oxide layers of at least the second and third plates.

22. A method according to claim 20, wherein the weak bonding area is formed by at least a first saw cut and wherein the depth of the first saw cuts is less than the thickness of the second plate.

23. A method according to claim 20, wherein d) is obtained by exerting a separation force between the first face of the third plate and the second face of the second plate at a lateral end of the stack of the second and third plates.

24. A method according to claim 20, further comprising, prior to the assembly of the second and third plates, formation of a thermal oxide layer on the surface of at least the second and third plates.

25. A method according to claim 24, wherein the bonding between the second face of the second plate and a first face of the third plate is a hydrophilic bonding, and the bonding between the first face of the second plate and the second face of the first plate is a hydrophobic bonding.

* * * * *